(12) United States Patent
Lai et al.

(10) Patent No.: US 10,410,577 B2
(45) Date of Patent: Sep. 10, 2019

(54) DISPLAY PANEL

(71) Applicant: PlayNitride Inc., Tainan (TW)

(72) Inventors: Yu-Hung Lai, Tainan (TW); Tzu-Yang Lin, Tainan (TW); Yun-Li Li, Tainan (TW); Yu-Yun Lo, Tainan (TW)

(73) Assignee: PlayNitride Inc., Hsinchu County (TW)

( * ) Notice: Subject to any disclaimer, the term of this patent is extended or adjusted under 35 U.S.C. 154(b) by 66 days.

(21) Appl. No.: 15/866,487

(22) Filed: Jan. 10, 2018

(65) Prior Publication Data

US 2018/0197461 A1 Jul. 12, 2018

(30) Foreign Application Priority Data

Jan. 10, 2017 (TW) .............................. 106100756 A

(51) Int. Cl.

| H01L 27/15 | (2006.01) |
| H01L 33/38 | (2010.01) |
| H01L 25/16 | (2006.01) |
| H01L 25/075 | (2006.01) |
| G09G 3/32 | (2016.01) |
| G09G 3/20 | (2006.01) |
| H01L 27/32 | (2006.01) |
| H01L 33/62 | (2010.01) |
| H01L 33/44 | (2010.01) |

(52) U.S. Cl.
CPC ............. *G09G 3/32* (2013.01); *G09G 3/2074* (2013.01); *H01L 25/0753* (2013.01); *H01L 25/167* (2013.01); *H01L 27/156* (2013.01); *H01L 27/326* (2013.01); *G09G 2300/0439* (2013.01); *H01L 33/382* (2013.01); *H01L 33/44* (2013.01); *H01L 33/62* (2013.01); *H01L 2224/48091* (2013.01); *H01L 2224/73257* (2013.01)

(58) Field of Classification Search
CPC ..... H01L 33/36; H01L 33/382; H01L 33/387; H01L 33/62; H01L 25/0753; H01L 25/167; H01L 27/156; H01L 27/3216; H01L 27/3218; H01L 27/326; G09G 3/32; G09G 3/2074
See application file for complete search history.

(56) References Cited

U.S. PATENT DOCUMENTS

2018/0174519 A1* 6/2018 Kim ..................... G09G 3/3233

FOREIGN PATENT DOCUMENTS

| TW | 201140871 | 11/2011 |
| TW | 201537777 | 10/2015 |
| TW | 201541675 | 11/2015 |
| TW | 201620153 | 6/2016 |

* cited by examiner

*Primary Examiner* — Thanhha S Pham
(74) *Attorney, Agent, or Firm* — JCIPRNET

(57) ABSTRACT

A display panel including a backplane and a plurality of micro LEDs is provided. The backplane includes a plurality of sub-pixels. Each of the sub-pixels has N sets of bonding pad. Each set of bonding pads includes a first electrical pad and X second electrical pads. N is an integer of 1~3, X is an integer of 2~4. The micro LEDs are respectively disposed in the sub-pixels, and the micro LED is electrically connected to one corresponding set of bonding pads of the N bonding pad sets. A first electrical carrier and a second electrical carrier are provided by the backplane to each of the micro LEDs through the one corresponding set of bonding pads.

15 Claims, 7 Drawing Sheets

DISPLAY PANEL

CROSS-REFERENCE TO RELATED APPLICATION

This application claims the priority benefit of Taiwan application serial no. 106100756, filed on Jan. 10, 2017. The entirety of the above-mentioned patent application is hereby incorporated by reference herein and made a part of this specification.

BACKGROUND OF THE INVENTION

1. Field of the Invention

The invention is related to a display panel.

2. Description of Related Art

The micro LED (µLED) has self-luminous display characteristics. Compared to the organic light emitting diode (OLED) technology which is also self-luminous display, the micro LED is high efficiency and relatively long-life. The material of the micro LED is not easily affected by the environment and relatively stable. Therefore, the micro LED is expected to exceed the organic light-emitting diode display technology to become the main stream of the future display technology.

However, when the micro LED is bonded on the substrate of the display panel, the following problems frequently occur. Because the size of the micro LED is smaller, the transfer and bonding process will become difficult. Under a general condition, the width of the P-type electrode and the width of the N-type electrode of the micro LED are designed to have the same size, and the material of the pad is often chosen from low-melting point metals (such as Indium, tin or alloy thereof). During the bonding process, it is needed to heat the pads on the substrate in order to make the pads transform into molten state, and the micro LED is pressed to contact the pads and electrically bond to the pads. However, with smaller micro LED, the spacing between two adjacent pads get smaller too, and it would cause the short circuit phenomenon.

To solve the short circuit problem, a way to solve the problem is that scaling down proportionally the widths of both P-type electrode and the N-type electrode of the micro LED, so as to enlarge the distance between two electrodes. However, because the size of the P-type electrode and N-type electrode is small, the structure of the micro LED is weak and cracks easily in the bonding process.

The above-mentioned problems may make the pixels fail in the display panel, and therefore reduce the manufacturing yield of the display panel or deteriorate the image property of the display panel. Based on the above, finding a solution to solve the problems listed abovementioned is one of the research focuses of the research personnel in the field.

SUMMARY OF THE INVENTION

The invention provides a display panel, which can significantly reduce the alignment difficulty, and has excellent production yield and image property.

The invention provides a display panel including a backplane and a plurality of micro LEDs. The backplane includes a plurality of sub-pixel. Each of the sub-pixels has N set of bonding pads. Each set of the bonding pads includes a first-type pad and X second-type pads. N is an integer of 1 to 3, X is an integer of 2 to 4. The micro LEDs are respectively disposed in the sub-pixel regions, and each of the micro LEDs is electrically connected to one corresponding set of bonding pads. A first electrical carrier and a second electrical carrier are provided to each of the micro LEDs through the one corresponding set of bonding pads.

In an embodiment of the invention, each of the micro LEDs includes a first type doped semiconductor layer, a second type doped semiconductor layer, a light emitting layer, a first electrode and a second electrode. The light emitting layer is located between the first type doped semiconductor layer and the second type doped semiconductor layer. The first electrode is electrically connected to the first type doped semiconductor layer and the first-type pad of one corresponding set of bonding pads. The second electrode is electrically connected to the second type doped semiconductor layer and at least one of the second-type pads of the corresponding bonding pad set.

In an embodiment of the invention, the first electrode and the second electrode are disposed at the same side of the light emitting layer.

In an embodiment of the invention, the first electrical carrier is transmitted to the light emitting layer through the first-type pad and the first electrode. The second electrical carrier is transmitted to the light emitting layer through the one of the second-type pads and the second electrode.

In an embodiment of the invention, each of the micro LEDs forms a projection region on the backplane. The first-type pad electrically connected to the micro LED is located in the projection region, and the second-type pad connected to the second electrode of the micro LED partially overlaps with the projection region of the micro LED.

In an embodiment of the invention, in the sub-pixels, a first distance between the first-type pad and the one of the second-type pads electrically connected to the second electrode is greater than a second distance between the one of the second-type pads and another second-type pad adjacent to the one of the second-type pads.

In an embodiment of the invention, the sub-pixels further include a repairing sub-pixel. The repairing sub-pixel includes one of the micro LEDs and a conductive device. The one of the micro LEDs is electrically connect to one set of bonding pads and includes a first type doped semiconductor layer, a second type doped semiconductor layer, a light emitting layer between the first type doped semiconductor layer, the second type doped semiconductor layer, a first electrode electrically connected to the first type doped semiconductor layer and a second electrode electrically connected to the second type doped semiconductor layer. The conductive layer is electrically connected to the second type doped semiconductor layer and one of the second-type pads.

In an embodiment of the invention, the another one of the second-type pads of the one set of bonding pads is corresponding to the second electrode.

In an embodiment of the invention, the one of the second-type pads electrically connected to the conductive device is outside a projection region of the one of the micro LEDs on the backplane. The first-type pad and another one of the second-type pads corresponding to the second electrode at least partially overlap with the projection region.

In an embodiment of the invention, the first electrical carrier is transmitted to the emitting layer through the first-type pad and the first electrode. The second electrical carrier is transmitted to the light emitting layer through the one of the second-type pad and the conductive device.

In an embodiment of the invention, the conductive device is located on the second type doped semiconductor layer, and the first electrode and the second electrode are located on the first type doped semiconductor layer.

In an embodiment of the invention, in each of the sub-pixels, a ratio of a distance between the first-type pad and the at least one of the second-type pads of bonding pads to a maximum width of the micro LED is between 0.1~0.6.

In an embodiment of the invention, for each of the micro LEDs, a ratio of a maximum width of the first electrode to a maximum width of the micro LED is 0.4~0.9.

In an embodiment of the invention, for each of the micro LEDs, a ratio of a maximum width of the second electrode to a maximum width of the micro LED is 0.1~0.4.

In an embodiment of the invention, each of the micro LEDs further comprises a through hole and an insulation layer. The through hole penetrates the first type doped semiconductor layer, the light emitting layer and a part of the second type doped semiconductor layer. The insulation layer is disposed on the first type doped semiconductor layer and on a sidewall of the through hole. The second electrode is disposed on the insulation layer and extends in the through hole to electrically connect to the second type doped semiconductor layer, and the first electrode is disposed on the first type doped semiconductor layer.

Based on the above, in each of the sub-pixels of the display panel of the embodiments in the invention, the micro LED is electrically connected through a corresponding set of bonding pads in the corresponding sub-pixel to receive the first electrical carrier and the second electrical carrier for emitting light. In detail, under a good bonding process, the display panel controls the micro LEDs with a first current path through the second electrode (the current carrier sequentially passes through one of the second-type pads, the second electrode, the second type doped semiconductor layer and into the light emitting layer, for example). If the second electrode is not bonded well to the one of the second-type pads, the display panel controls the micro LEDs with a second current path through the conductive device (the current carrier sequentially passes through another one of the second-type pads, the conductive device, the second type doped semiconductor layer and into the light emitting layer, for example). Therefore, the dead pixels can be reduced, and the excellent production yields and image property can be provided in the display panel of the embodiment of the invention.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
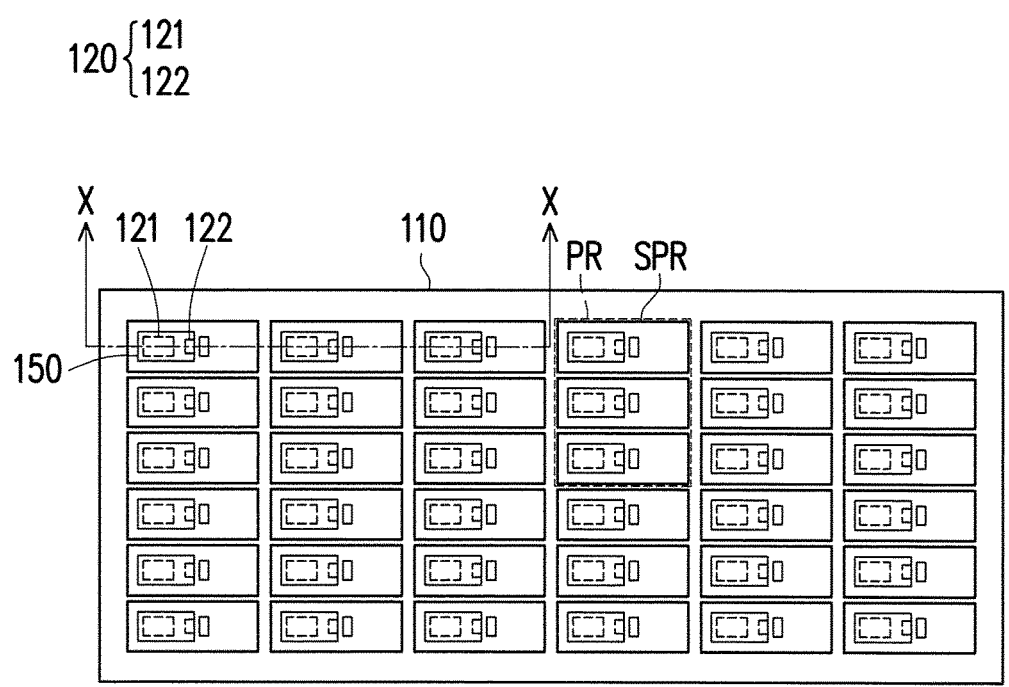
FIG. 1 is a schematic top view of the display panel according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
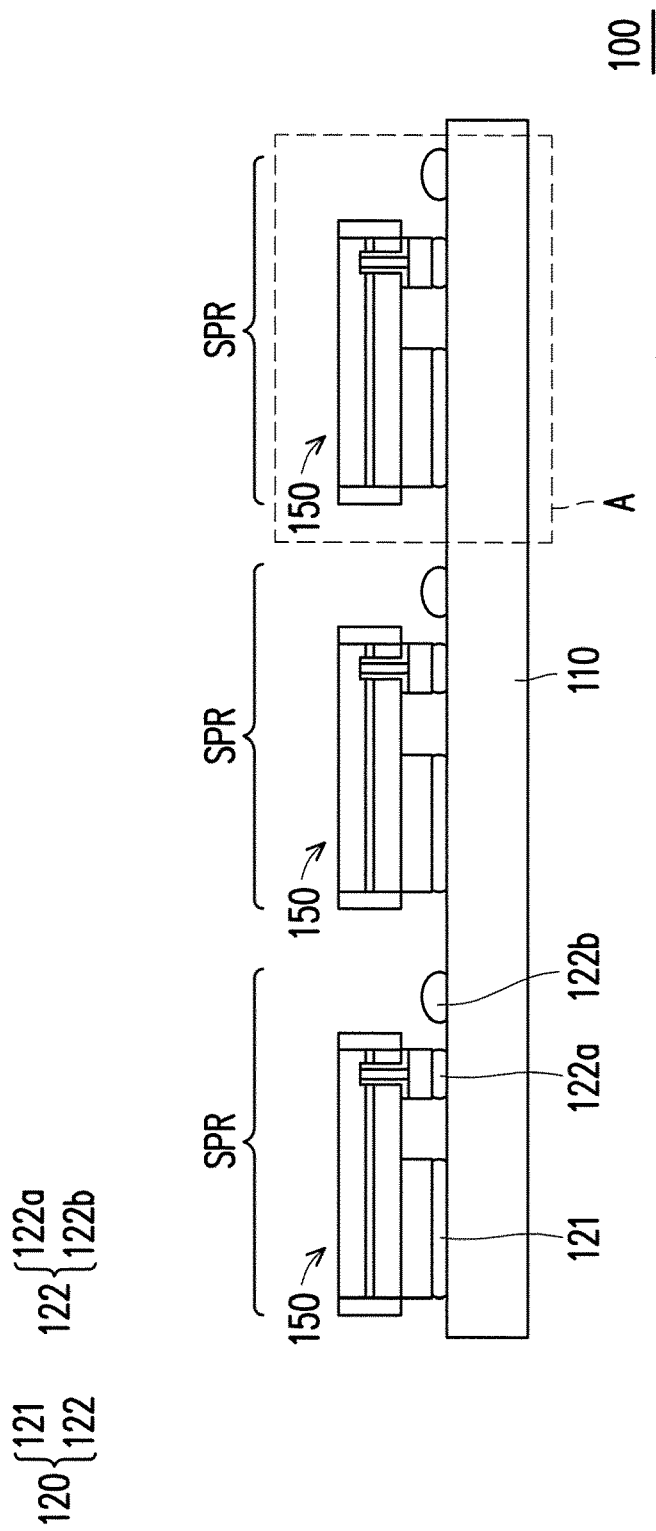
FIG. 2 is a schematic cross-sectional view along line X-X in FIG. 1.
Figure 3A:
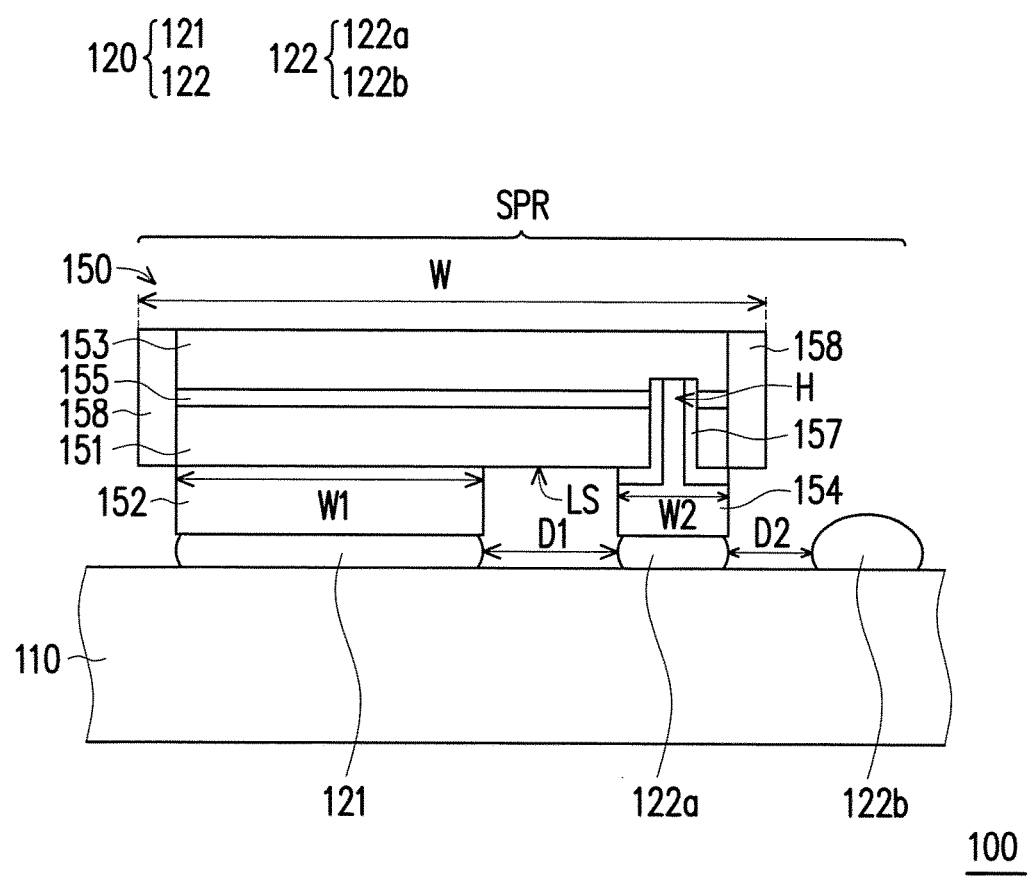
FIG. 3A is an enlarged schematic cross-sectional view of region A in FIG. 2.
Figure 3B:
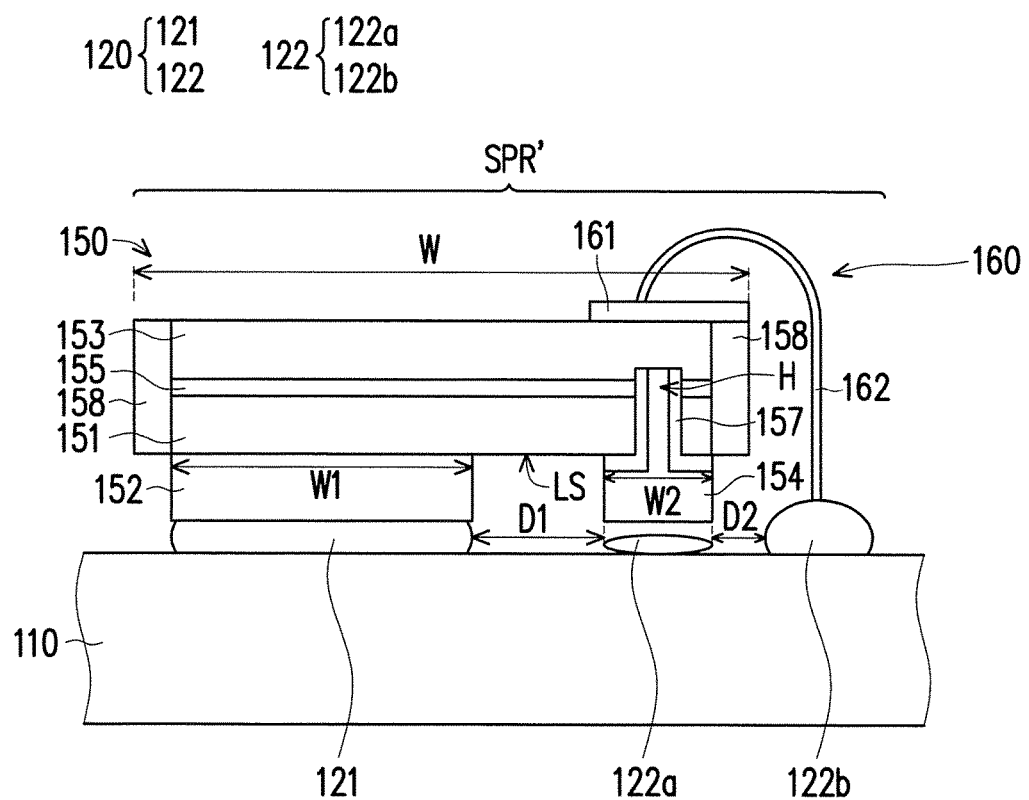
FIG. 3B is an enlarged schematic cross-sectional view of the repairing sub-pixel.

FIG. 1 is a schematic top view of a display panel 100 according to an embodiment of the invention. FIG. 2 is a schematic cross-sectional view along line X-X in FIG. 1. FIG. 3A is an enlarged schematic cross-sectional view of region A in FIG. 2. FIG. 3B is an enlarged schematic cross-sectional view of the repairing sub-pixel.

Referring to FIG. 1, FIG. 2 and FIG. 3A, in the embodiment, the display panel 100 is substantially a micro LED display panel. The display panel 100 includes a backplane 110 and a plurality of micro LEDs 150. Referring to FIG. 1, the backplane 110 includes a plurality of pixels PR arranged in an array. Each pixel region PR further includes a plurality of sub-pixels SPR.

For example, the backplane 110 can be semiconductor substrate, submount, complementary metal-oxide-semiconductor (CMOS) circuit substrate, liquid crystal on silicon (LCOS) substrate, thin film transistor (TFT) substrate or substrate of other types, the invention is not limited thereto. In the embodiment, the backplane 110 is substantially thin film transistor (TFT) substrate and each pixel PR includes three sub-pixels SPR. The size of the micro LED 150 is in micron-size, for example. In detail, the length of the diagonal line of the micro LED 150 falls in a range of 3 micrometers to 150 micrometer, for example.

Each of the sub-pixels SPR has N sets of bonding pads 120 and one of the micro LED 150, and each set of the bonding pads 120 includes a first-type pad 121 and X second-type pads 122, wherein N is an integer of 1~3, and X is an integer of 2~4. In the embodiment, one set of bonding pads 120 (N=1) is disposed in each of the sub-pixels SPR for example, and the set of the bonding pads 120 has one first-type pad 121 and two second-type pads 122a, 122b for example, but the invention is not limited thereto. In other embodiments, the number of the second-type pads 122 can be 3 (X=3) or 4 (X=4), and two sets of bonding pads 120 (N=2) or three sets of bonding pads 120 (N=3) can also be disposed in each of the sub-pixels SPR. The transfer and bonding yield and the repairing rate can be increased with more sets of bonding pads, however, it is required to enlarge the area of the sub-pixel SPR to accommodate more sets of bonding pads and more second-type pads and the resolution of display panel will decrease.

Referring to FIG. 2 and FIG. 3A, the micro LEDs 150 are flip-chip type in the embodiment. In detail, each micro LED 150 is correspondingly bonded to one set of bonding pads 120. Each of the micro LEDs 150 includes a first type doped semiconductor layer 151 (P-type doped semiconductor layer, for example, but the invention is not limited thereto), a second type doped semiconductor layer 153 (N-type doped semiconductor layer, for example, but the invention is not limited thereto), a light emitting layer 155, a through hole H, an insulation layer 157, a first electrode 152 and a second electrode 154. The light emitting layer 155 is located between the first type doped semiconductor layer 151 and the second type doped semiconductor layer 153. The first electrode 152 is electrically connected to the first type doped semiconductor layer 151 and the first-type pad 122 of the corresponding set of bonding pads 120. The second electrode 154 is electrically connected to the second type doped semiconductor layer 153 and one of the second-type pads 122 of the corresponding set of bonding pads 120 (second-type pad 122a, for example). More specifically, another one of the second-type pad 122b is not connected to the second electrode 154.

The through hole H penetrates the first type doped semiconductor layer 151, the light emitting layer 155 and a part of the second type doped semiconductor layer 153. The insulation layer 157 is disposed on the first type doped semiconductor layer 151 and a sidewall of the through hole H, specifically, the insulation layer 157 is disposed on a part of surface LS of the first type doped semiconductor layer 151. The first electrode 152 and the second electrode 154 are disposed at the same side of the light emitting layer 155, the second electrode 154 is disposed on the insulation layer 157 and extends in the through hole H to electrically connect to the second type doped semiconductor layer 153. The second electrode 154 is connected to the second-type pad 122a on the backplane 110. The insulation layer 157 is configured to electrically isolate the second electrode 154 from a side wall of the first type doped semiconductor layer 151 and a side wall of the light emitting layer 155. The material of the insulation layer 157 is composed of inorganic material or organic material, for example. In the embodiment, the material of the insulation layer 157 is silicon nitride and silicon oxide, for example, the invention is not limited thereto.

In addition, in the embodiment, the micro LED 150 further includes a protection layer 158. The protection layer 158 covers the sidewall of the micro LED 150. The protection layer 158 is configured to prevent the micro LED 150 from the influence of the moisture or dust outside, so as to increase the lifetime of the micro LED 150. In the embodiment, the protection layer 158 and the insulation layer 157 are the same layer and the material of the protection layer 158 is, for example, organic insulation material (such as photoresist material) or inorganic insulation material (such as silicon oxide thin film), the invention is not limited thereto.

In the embodiment, the width W1 of the first electrode 152 is larger than the width W2 of the second electrode 154. The ratio of the spacing D1 between the first-type pad 121 and the second-type pad 122a adjacent to the first-type pad 121 to the maximum width W of the micro LED 150 is in a range of 0.1 to 0.6, preferably, the ratio of D1/W is less than 0.3. Through the design of the ratio (D1/W), a larger bonding area between the first electrode 152, the second electrode 154 and the first-type pad 121, the second-type pad 122a is provided. The short circuit can be prevented.

On the other hand, the ratio of the width W1 of the first electrode 152 to the maximum width W of the micro LED 150 falls in a range of 0.4~0.9. When the ratio (W1/W) falls in this range, the crack probability of the micro LED 150 can be reduced. The ratio (W2/W) of the width W2 of the second electrode 154 to the maximum width W of the micro LED 150 falls in a range of 0.1~0.4.

Referring to FIG. 3A, in each of the sub-pixel regions SPR, the micro LED 150 forms a projection region on the backplane 110. The first-type pad 121 and the second-type pad 122a electrically connected to the micro LED 150 are located in the projection region. The another second-type pad 122b not connected to the second electrode 154 is located outside the projection region. In addition, in the embodiment, a spacing between the first-type pad 121 and the second-type pad 122a corresponding to the second electrode 154 is a first distance D1. A distance between the second-type pad 122a corresponding to the second electrode 154 and another adjacent second-type pad 122b is a second distance D2. The first distance D1 is greater than the second distance D2.

In the embodiment, the material of the first-type pad 121 and the second-type pads 122 is, for example, chosen from Indium (In), Stannum (Sn) or an alloy thereof (In/Sn), but the invention is not limited thereto. The material of the first electrode 152 and the second electrode 154 is, for example, chosen from gold (Au), Sn or an alloy thereof (Au/Sn), the invention is not limited thereto.

In the embodiment, the material of the P-type doped semiconductor layer is, for example, p-GaN. The material of the N-type doped semiconductor layer is, for example, n-GaN, but the invention is not limited thereto. On the other hand, the structure of the light emitting layer 155 is, for example, multiple quantum well (MQW). The multiple quantum well includes a plurality of wells and a plurality of barriers alternately disposed. Furthermore, the material of the light emitting layer 155 includes, for example, alternately stacked multi-layers InGaN and multi-layers GaN. Through the design of the ratio of In or Gallium (Ga) in the light emitting layer 155, the light emitting layer 155 can emit light with different wavelength range. It should be noted that the material of the light emitting layer 155 listed above are for exemplary purpose only, and the material of the light emitting layer 155 are not limited to InGaN and GaN.

In the embodiment, the micro LED 150 is electrically connected to the corresponding set of bonding pads 120 to receive the first electrical carrier (such as hole) and the second electrical carrier (such as electron) to emit light. Specifically, the backplane 110 provides the first electrical carrier and the second electrical carrier to the micro LEDs 150. In the embodiment, the current carrier transmission path is described as bellow: the first electrical carrier is transmitted to the light emitting layer 155 through the first-type pad 121, the first electrode 152, and the first type doped semiconductor layer 151. The second electrical carrier is transmitted to the emitting layer 155 through the second-type pad 122a, the second electrode 154 and the second type doped semiconductor layer 153. The first electrical carrier and the second electrical carrier are recombined in the light emitting layer 155 to emit light.

Based on the above, after the transferring and bonding process between the micro LEDs 150 and the backplane 110 is completed, the testing step is performed to test that whether the micro LEDs 150 on the backplane 110 can be controlled to lit up or not. Under the good bonding process, as FIG. 3A shown, the micro LED 150 is electrically connected to the first-type pad 121 and the second-type pad 122a successfully, so that the second-type pad 122b is, for example, in a redundant state.

However, as FIG. 3B shown, the micro LED 150 is not electrically connected to the first-type pad 121 and the second-type pad 122a successfully in some sub-pixel SPR. In detail, the second electrode 154 of the micro LED 150 in a repairing sub-pixel SPR' is not electrically connected to the second-type pad 122a of the set of bonding pads corresponding to the micro LED 150. The repairing sub-pixel SPR' further has a conductive device 160. The conductive device 160 includes a conductive layer 161 disposed on the second type doped semiconductor layer 153 and a metal line 162 electrically connecting the conductive layer 161 to another second-type pad 122b by wire-bonding method.

Specifically, the material of the conductive layer 161 is, for example, transparent conductive material (such as ITO), or other conductive metal, alloy film, but the invention is not limited thereto. The second electrode 154 and the conductive layer 161 are located at two opposite sides of the second type doped semiconductor layer 153 respectively. Therefore, the first electrical carrier provided by the backplane 110 sequentially passes through the first-type pad 121, the first electrode 152, the first type doped semiconductor layer 151 and into the light emitting layer 155. The second electrical carrier provided by the backplane 110 sequentially passes through the second-type pad 122b, the conductive device 160 and the second type doped semiconductor layer 153 and into the light emitting layer 155.

In other words, even if the second electrodes 154 are not electrically connected to the second-type pads 122a in a defect sub-pixel and the second electrical carrier fail to transmit into the second electrode 154, the repairing process will be executed to repair the defect sub-pixel. The conductive device 160 is formed in each of the repairing sub-pixel SPR', so that the second electrical carrier is transmitted to the light emitting layer 155. Specifically, a second current carrier transmission path is formed in the repairing sub-pixel SPR' through the second-type pad 122b and the conductive device 160. In such a way, the first electrical carrier and the second electrical carrier are recombined in the light emitting layer 155 to emit light.

Specifically, the forming method of the conductive device 160 is, for example, forming the conductive film on the micro LED 150 on the backplane 110. The forming method of the conductive film is, for example, a spin coating method or a deposition method, the invention is not limited thereto. Then, the pattern of the conductive film is defined by the photolithography and an etching process to form the conductive layer 161. The connection is achieved by the metal wire 162 in the embodiment. In another embodiment, it can also be achieved by the methods such as applying conductive glue, or extending the conductive layer 161, for example. Furthermore, in another embodiment, the conductive layer 161 can be a transparent film covering the second type doped semiconductor layer 153 and extended to the second-type pad 122b, the invention is not limited to the forming method of the conductive device 160.

It should be noted that in the embodiment, the display panel 100 controls the micro LEDs 150 through driving unit (not shown), a plurality of data lines (not shown), a plurality of scan lines (not shown) and a plurality of transistors (not shown), so as to control the light color of the pixel PR, for example. The operation of the display panel 100 may be provided with sufficient teachings, suggestions and implementation instructions from the common knowledge of the technical field, and therefore it will not be repeated herein.

It should be noted that the following embodiments use part of the content in the above-mentioned embodiments, omit the descriptions of the same technical content, the same element can be referred to part of the content of the above-mentioned embodiments, and are not repeated in the following embodiments.

Figure 4:
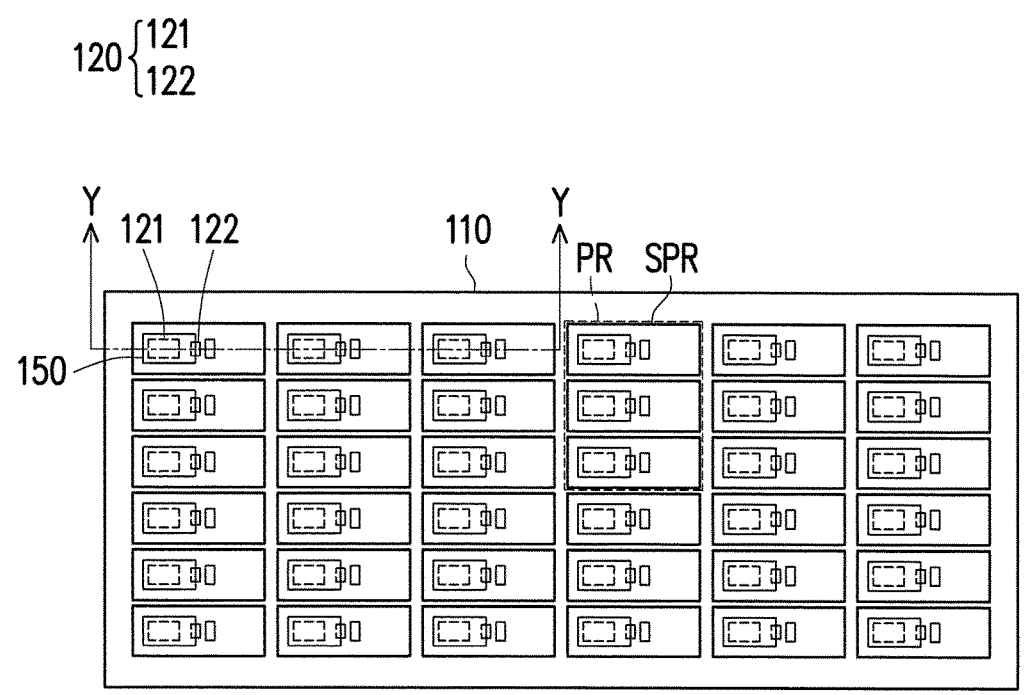
FIG. 4 is a schematic top view of the display panel according to another embodiment of the invention.
Figure 5:
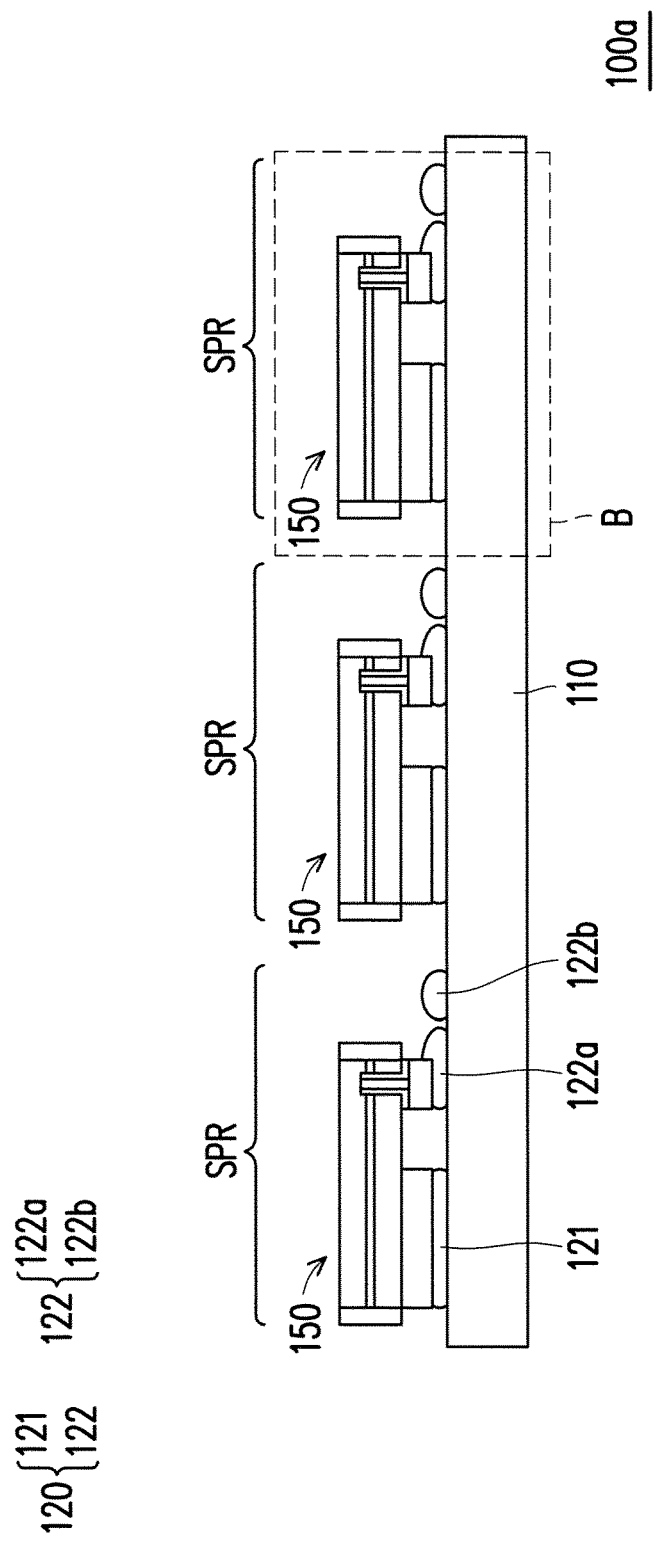
FIG. 5 is a schematic cross-sectional view of the display panel along line Y-Y in FIG. 4.
Figure 6:
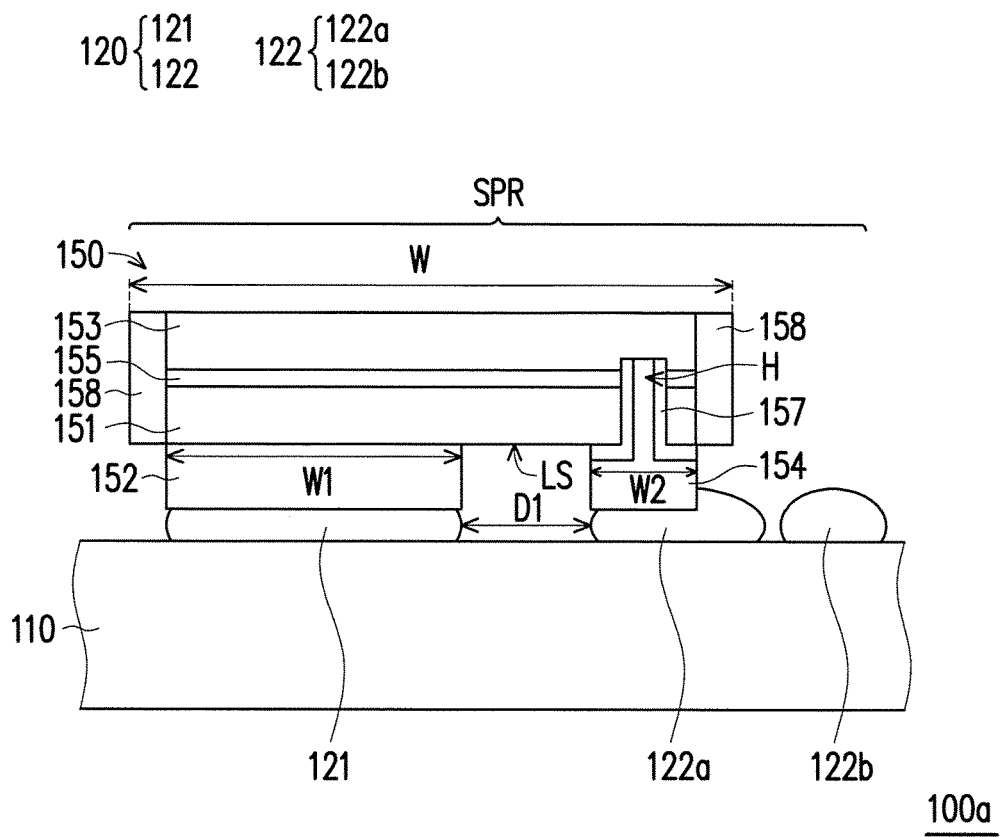
FIG. 6 is an enlarged schematic cross-sectional view of region B in FIG. 5.

FIG. 4 is a schematic top view of a display panel 100a according to another embodiment of the invention. FIG. 5 is a schematic cross-sectional view of the display panel 100a along line Y-Y in FIG. 4. FIG. 6 is an enlarged schematic cross-sectional view of region B in FIG. 5.

Referring to FIG. 4 to FIG. 6, in the line Y-Y passing through the sub-pixels SPR, the display panel 100a is similar to the display panel 100 of FIG. 2, the difference between display panel 100 and display panel 100a is that: each of the micro LEDs 150 forms the projection region on the backplane 110, the second-type pad 122a of the corresponding set of bonding pads 120 electrically connected to the second electrode 154 of the micro LED 150 is partially located outside the projection region. In detail, the first-type pad 122a is located in the projection region, the other second-type pad 122b which is not connected to the second electrode 154 is located outside the projection region, and the second-type pad 122a is partially overlaps with the projection region. In other words, a part of the second-type pad 122a is located outside the projection region.

Based on the above, in the display panel (100, 100a) of the embodiment in the invention, the micro LED 150 in each of the sub-pixel SPR is electrically connected to the corresponding set of bonding pads 120 to receive the first electrical carrier and the second electrical carrier for emitting light. In detail, the display panel of the embodiment of the invention provides two selective current carrier transmission paths so that the repairing process become easy and the process cost of the display panel will reduce. More specifically, if the first electrode 152 and the second electrode 154 of micro LED 150 in the sub-pixel SPR form an excellent electrically connection with the first-type pad 121 of the corresponding set of bonding pads 120 and one of the second-type pads 122 (the second-type pad 122a) respectively, then the second electrical carrier provided by the backplane 110 is transmitted to the light emitting layer 155 through the second-type pad 122a, the second electrode 154 and the second type doped semiconductor layer 153 (first current carrier transmission path). If the second electrode 154 of the micro LED 150 in the defect sub-pixel SPR fails to form an excellent electrical connection with the second-type pad 122a, then repairing the defect sub-pixel with the conductive device 160 to form a repairing sub-pixel, and the second current carrier transmission path can be formed in the repairing sub-pixel. The second electrical carrier provided by the backplane 110 is transmitted to the light emitting layer 155 through the second-type pad 122b, the conductive device 160 and the second type doped semiconductor layer 153 (second current carrier transmission path). Therefore, the number of defect pixels can be reduced, and the display panel of the embodiment of the invention has excellent production yields and image property.

Based on the above, in each of the sub-pixels in the display panel of the embodiments in the invention, the micro LED is electrically connected through one corresponding set of bonding pads of the N sets of bonding pads in the corresponding sub-pixel to receive the first electrical carrier and the second electrical carrier for emitting light. Even under the bad bonding condition, the defect sub-pixel cloud be repair easily. Therefore, the probability of generating defect pixels can be reduced, and the display panel of the embodiment of the invention has excellent production yields and image property.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A display panel, comprising:
   a backplane, comprising a plurality of sub-pixels, each of the sub-pixels having N sets of bonding pads, each set of the bonding pads comprising a first-type pad and X second-type pads, wherein N is an integer of 1~3, and X is an integer of 2~4; and a plurality of micro LEDs, respectively disposed in the sub-pixels, and each of the micro LEDs being electrically connected to one corresponding set of bonding pads, wherein a first electrical carrier and a second electrical carrier are provided by the backplane to each of the micro LEDs through the one corresponding set of bonding pads.

2. The display panel according to claim 1, wherein each of the micro LEDs comprises:

a first type doped semiconductor layer;

a second type doped semiconductor layer;

a light emitting layer, located between the first type doped semiconductor layer and the second type doped semiconductor layer;

a first electrode, electrically connected to the first type doped semiconductor layer and the first-type pad of one corresponding set of bonding pads; and a second electrode, electrically connected to the second type doped semiconductor layer and at least one of the second-type pads of the one corresponding set of bonding pads.

3. The display panel according to claim 2, wherein the first electrode and the second electrode are disposed at the same side of the light emitting layer.

4. The display panel according to claim 2, wherein the first electrical carrier is transmitted to the light emitting layer through the first-type pad and the first electrode, and the second electrical carrier is transmitted to the light emitting layer through the one of the second-type pads and the second electrode.

5. The display panel according to claim 2, wherein each of the micro LEDs forms a projection region on the backplane, the first-type pad electrically connected to the micro LED is located in the projection region, and the second-type pad connected to the second electrode of the micro LED partially overlaps with the projection region of the micro LED.

6. The display panel according to claim 2, wherein in the sub-pixels, a first distance between the first-type pad and the one of the second-type pads electrically connected to the second electrode is greater than a second distance between the one of the second-type pads and another second-type pad adjacent to the one of the second-type pads.

7. The display panel according to claim 1, wherein the sub-pixels further comprise a repairing sub-pixel, and the repairing sub-pixel comprises:

one of the micro LEDs electrically connect to one set of bonding pads and comprising a first type doped semiconductor layer, a second type doped semiconductor layer, a light emitting layer located between the first type doped semiconductor layer and the second type doped semiconductor layer, a first electrode electrically connected to the first type doped semiconductor layer and a second electrode electrically connected to the second type doped semiconductor layer; and a conductive device electrically connected to the second type doped semiconductor layer and another one of the second-type pads.

8. The display panel according to claim 7, wherein the another one of the second-type pads of the one set of bonding pads is corresponding to the second electrode.

9. The display panel according to claim 8, wherein the one of the second-type pads electrically connected to the conductive device is outside a projection region of the one of the micro LEDs on the backplane, the first-type pad and another one of the second-type pads corresponding to the second electrode at least partially overlap with the projection region.

10. The display panel according to claim 7, wherein the first electrical carrier is transmitted to the light emitting layer through the first-type pad and the first electrode, and the second electrical carrier is transmitted to the light emitting layer through the one of the second-type pad and the conductive device.

11. The display panel according to claim 7, wherein the conductive device is located on the second type doped semiconductor layer, and the first electrode and the second electrode are located on the first type doped semiconductor layer.

12. The display panel according to claim 2, wherein in each of the sub-pixels, a ratio of a spacing between the first-type pad and the at least one of the second-type pads of the one corresponding set of bonding pads to a maximum width of the micro LED in the sub-pixel is 0.1~0.6.

13. The display panel according to claim 2, wherein for each of the micro LEDs, a ratio of a maximum width of the first electrode to a maximum width of the micro LED is 0.4~0.9.

14. The display panel according to claim 2, wherein for each of the micro LEDs, a ratio of a maximum width of the second electrode to a maximum width of the micro LED is 0.1~0.4.

15. The display panel according to claim 2, wherein each of the micro LEDs further comprises a through hole and an insulation layer, the through hole penetrates the first type doped semiconductor layer, the light emitting layer and a part of the second type doped semiconductor layer, the insulation layer is disposed on the first type doped semiconductor layer and on a sidewall of the through hole, wherein the second electrode is disposed on the insulation layer and extends in the through hole to electrically connect to the second type doped semiconductor layer, and the first electrode is disposed on the first type doped semiconductor layer.

* * * * *